US008983804B2

(12) United States Patent
Houdouin et al.

(10) Patent No.: US 8,983,804 B2
(45) Date of Patent: Mar. 17, 2015

(54) UPDATING A MODELED OBJECT

(75) Inventors: Jean-Michel Houdouin, La Garenne Colombes (FR); Luca D'Amato, Paris (FR); Steve Chauvet, Velizy-Villacoublay (FR)

(73) Assignee: Dassault Systemes, Velizy Villacoublay Cedex (FR)

( * ) Notice: Subject to any disclaimer, the term of this patent is extended or adjusted under 35 U.S.C. 154(b) by 287 days.

(21) Appl. No.: 13/325,875

(22) Filed: Dec. 14, 2011

(65) Prior Publication Data

US 2012/0173208 A1 Jul. 5, 2012

(30) Foreign Application Priority Data

Dec. 30, 2010 (EP) .................................... 10306544

(51) Int. Cl.
*G06F 17/50* (2006.01)
*G06T 17/10* (2006.01)
*G06T 19/00* (2011.01)
*G06T 15/20* (2011.01)
*G06T 17/00* (2006.01)

(52) U.S. Cl.
CPC ............... *G06F 17/50* (2013.01); *G06T 17/10* (2013.01); *G06T 19/00* (2013.01); *G06T 15/20* (2013.01); *G06T 17/00* (2013.01); *G06T 2200/24* (2013.01)
USPC ............................................................ 703/1

(58) Field of Classification Search
None
See application file for complete search history.

(56) References Cited

U.S. PATENT DOCUMENTS

| 5,850,535 | A | 12/1998 | Maystrovsky et al. |
| 6,341,291 | B1 | 1/2002 | Bentley et al. |
| 7,079,114 | B1 * | 7/2006 | Smith et al. ................... 345/158 |
| 7,313,504 | B2 | 12/2007 | Chin et al. |
| 7,755,621 | B2 | 7/2010 | Kripac |
| 7,913,190 | B2 * | 3/2011 | Grimaud et al. .............. 715/848 |

(Continued)

FOREIGN PATENT DOCUMENTS

| EP | 1501026 A1 | 1/2005 |
| EP | 2028623 A1 | 2/2009 |
| WO | WO 2008/127254 A1 | 10/2008 |

OTHER PUBLICATIONS

Kahl, W., et al., "Amalgamating Pushout and Pullback Graph Transformation in Collagories," *Lecture Notes in Computer Science*, vol. 6372, pp. 362-378 (2010).

(Continued)

*Primary Examiner* — Omar Fernandez Rivas
*Assistant Examiner* — Cuong Luu
(74) *Attorney, Agent, or Firm* — Hamilton, Brook, Smith & Reynolds, P.C.

(57) ABSTRACT

A computer-implemented method for updating a modeled object comprises providing an old operand of an operation, a result of applying the operation to the old operand, wherein applying the operation to the old operand includes computing old sub-results, each old sub-result being determined by a respective old sub-operand of the old operand, and a new operand including a first set of sub-operands of the new operand at least partially identical to old sub-operands of the old operand, and a second set of new sub-operands. The method further comprises applying the operation on the new operand, including computing new sub-results determined by a respective sub-operand of the second set; and retrieving the old sub-results determined by the old sub-operands of the old operand to which sub-operands of the first set are at least partially identical. Such a method improves the update of the modeled object.

14 Claims, 9 Drawing Sheets

(56) References Cited

U.S. PATENT DOCUMENTS

| | | | |
|---|---|---|---|
| 8,248,407 B2* | 8/2012 | Deslandes | 345/420 |
| 8,305,376 B2* | 11/2012 | Ran et al. | 345/420 |
| 8,429,174 B2* | 4/2013 | Ramani et al. | 707/749 |
| 2003/0085889 A1 | 5/2003 | Chin et al. | |
| 2007/0291028 A1 | 12/2007 | Kripac | |
| 2008/0140732 A1 | 6/2008 | Wilson et al. | |
| 2008/0255809 A1* | 10/2008 | Ran et al. | 703/1 |
| 2008/0309678 A1 | 12/2008 | Reghetti et al. | |
| 2010/0274818 A1 | 10/2010 | Chauvin et al. | |
| 2012/0109589 A1* | 5/2012 | Thompson et al. | 703/1 |
| 2012/0109591 A1* | 5/2012 | Thompson et al. | 703/1 |
| 2012/0173212 A1 | 7/2012 | Rameau et al. | |
| 2012/0316841 A1 | 12/2012 | Rameau et al. | |
| 2013/0311450 A1* | 11/2013 | Ramani et al. | 707/722 |

OTHER PUBLICATIONS

Jahnke, J.H., et al., "A case study in Supporting Schema Evolution of Complex Engineering Information Systems," Paper presented at the meeting of Computer Software and Applications Conference, 1998, COMPSAC'98 Proceedings, The Twenty-Second Annual International Vienna, pp. 513-520 (Aug. 19, 1998).

Rodden, et al., "A Survey of CSCW Systems", *Interacting with Computers*, 3(3):319-353 (Dec. 1, 1999).

Nan, Niu, et al., "A Category-theoretic Approach to Syntactic Software Merging", Paper presented at the meeting of Software Maintenance, 21$^{st}$ IEEE International Conference on Sep. 25-30, 2005, Piscataway, NJ, pp. 197-206 (Sep. 25, 2005).

Cheung, Gary K. L., et al., "Incremental Rendering of Deformable Trimmed NURBS Surfaces," Paper presented at the meeting of Proceedings of the ACM Symposium on Virtual Reality Software and Technology, pp. 48-55 (Jan. 1, 2003-Mar. 10, 2003).

Woerdenweber, B., "Surface Triangulation for Picture Production," *IEEE Computer Graphics and Applications*, 3(8):45-51 (Nov. 1, 1983).

Guo, B. et al., "Local Shape Control for Free-form Solids in Exact CSG Representation," *Computer Aided Design*, 28(6):483-493 (Jun. 7, 1996).

Hsu, C., et al., "A Constraint-Based Manipulator Toolset for Editing 3D Objects," Paper presented at meeting on Proceedings of the Fourth Symposium on Solid Modeling and Applications Atlanta, GA, Symp(4):168-180 (May 14, 1997).

Sohrt, W., et al., "Interaction with Constraints in 3D Modeling," Paper presented at meeting on Symposium on Solid Modeling Foundations and CAD/CAM Applications, pp. 387-396, (Jun. 5, 1991).

Tilove, R.B., "A Null-Object Detection Algorithm for Constructive Solid Geometry," Communication of the ACM, 27(7):684-694 (Jul. 1984).

Mens, T., "On the Use of Graph Transformations for Model Refactoring," University of Mons-Hainaut, Belgium, *Lecture Notes in Computer Science*, 2006, vol. 4143, Generative and Transformational Techniques in Software Engineering, pp. 219-257.

Diskin, Z. et al., "Scenario Integration via Higher-Order Graphs," Technical Report No. 2006-517, Queens University, Kingston, Ontario, Canada (2006).

Cazals, F., et al., "Reporting Maximal Cliques: New Insight into an Old Problem," INRIA research report No. 5615, France (Jan. 2007).

European Search Report for European Application No. EP 10306542 dated May 25, 2011.

Sadeghi, M. et al., "Support for effective change management in product data management systems," Paper presented at Computers and Industrial Engineering, 2009, International Conference on IEEE, Piscataway, NJ, pp. 1514-1519 (Jul. 6, 2009).

Yan, S., et al., "An asynchronous CAD collaborative design model", Paper presented at Computer Application and System Modeling (ICCASM), 2010 International Conference on IEEE, Piscataway, NJ, pp. V6-563-V6-566 (Oct. 22, 2010).

Ebrahim, Batgheri, et al., "An exploratory classification of applications in the realm of collaborative modeling and design," *Information Systems and E-Business Management*, 8(3):257-286 (Nov. 15, 2008).

European Search Report for European Patent Application EP 10306544 dated Jun. 21, 2011.

Schmidt, R., et al., "Interactive implicit modeling with hierarchical spatial caching," *Fibres and Optical Passive Components*, 2005, pp. 104-113 (Jun. 13, 2005).

Pariente, F., et al., "Incremental and localized update of convex decomposition used for form feature recognition," *Computer Aided Design*, 28(8):589-602 (Aug. 1, 1996).

European Search Report for European Application EP 10306543 dated May 27, 2011.

Laako, T., et al., "Feature Models for Design and Manufacturing," 23$^{rd}$ Annual Hawaii International Conference on System Sciences Proceedings, 2: 445-454 (Jan. 2-5, 1990).

Mens T., "A Formal Foundation for Object-Oriented Software Evolution," pp. 1-4 (2001).

Brunet, G., et al., "A Manifesto for Model Merging," *International Workshop on Global Integrated Model Management Proceedings*, pp. 5-11 (2006).

West, S., and Kahl, W., "A Generic Graph Transformation, Visualisation, and Editing Framework in Haskell," *ECEASST*, pp. 1-18 (2009).

Rho, J., and Wu, C., "An Efficient Version Model of Software Diagrams," *Asia-Pacific Conference on Software Engineering*, pp. 236-243 (1998).

Godfrey, M., and Zou, L., "Using Origin Analysis to Detect Merging and Splitting of Source Code Entities," *IEEE Trans. on Software Engineering*, 31(2): 166-181 (2005).

Wiemann, Helge, "Theory of Graph Transformations." (1995), http://www.informatik.uni-bremen.de/st/lehre/Artefakt/Seminar/Ausarbeitungen/04_Theorie_Graphtransformationen.pdf.

* cited by examiner

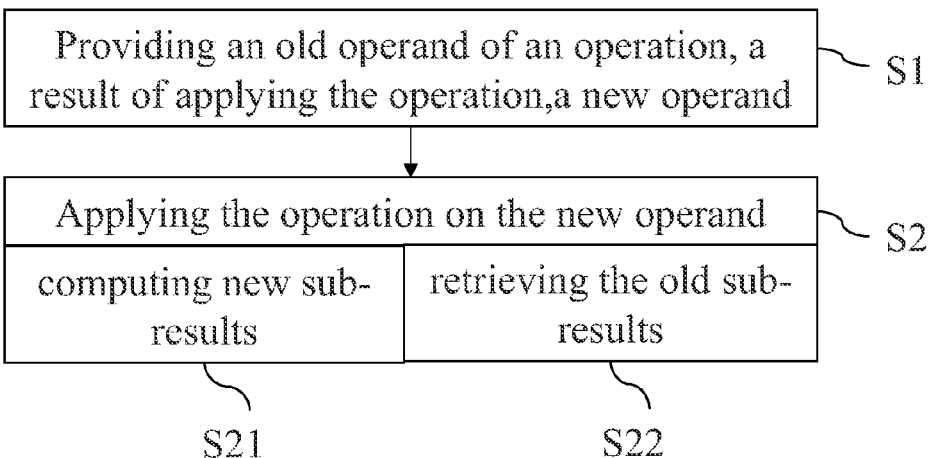
FIG. 1
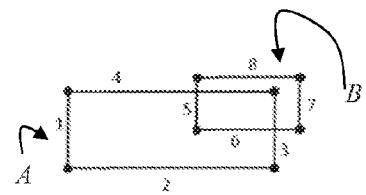
FIG. 2
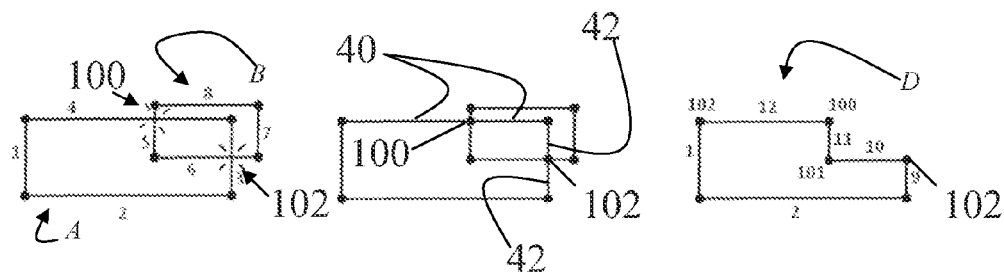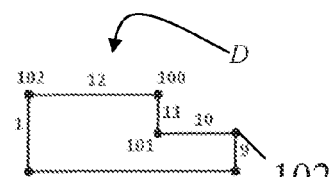
FIG. 3    FIG. 4    FIG. 5

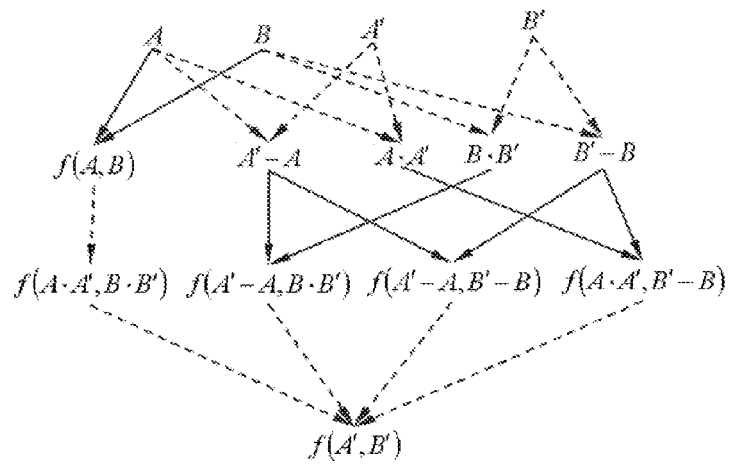
FIG. 12
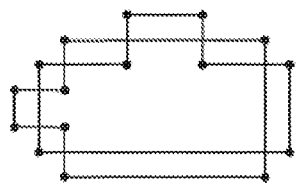
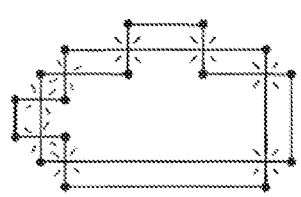
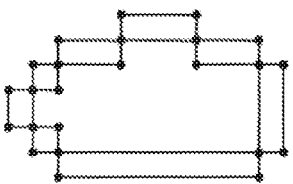
FIG. 13   FIG. 14   FIG. 15
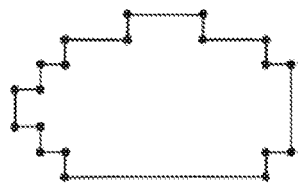
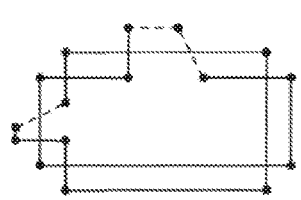
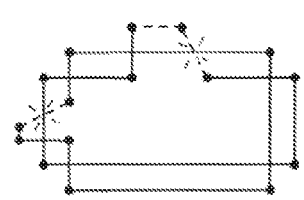
FIG. 16   FIG. 17   FIG. 18

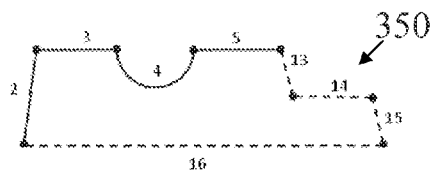
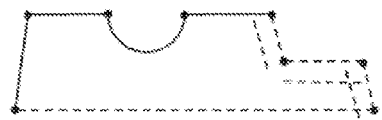
FIG. 35        FIG. 36
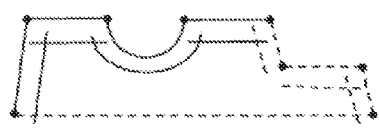
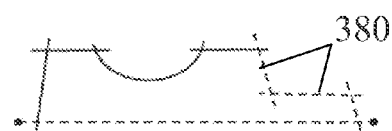
FIG. 37        FIG. 38
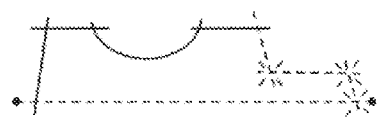
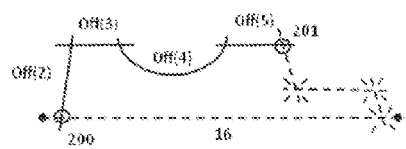
FIG. 39        FIG. 40
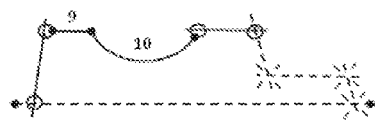
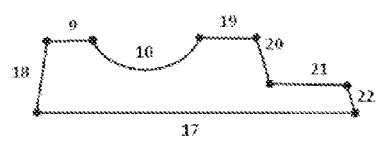
FIG. 41        FIG. 42

UPDATING A MODELED OBJECT

RELATED APPLICATION(S)

This application claims priority under 35 U.S.C §119 or 365 to European Application No. 10306544.7, filed Dec. 30, 2010.

The entire teachings of the above application(s) are incorporated herein by reference.

FIELD OF THE INVENTION

The invention relates to the field of computer programs and systems, and more specifically to a method, system and program for updating a modeled object.

BACKGROUND

Computer-aided techniques are known to include Computer-Aided Design or CAD, which relates to software solutions for authoring product design. Similarly, CAE is an acronym for Computer-Aided Engineering, e.g. it relates to software solutions for simulating the physical behavior of a future product. CAM stands for Computer-Aided Manufacturing and typically includes software solutions for defining manufacturing processes and operations.

A number of systems and programs are offered on the market for the design of objects (e.g. parts or assemblies of parts), forming a product, such as the one provided by Dassault Systemes under the trademark CATIA. These CAD systems allow a user to construct and manipulate complex three dimensional (3D) models of objects or assemblies of objects. CAD systems thus provide a representation of modeled objects using edges or lines, in certain cases with faces. Lines or edges may be represented in various manners, e.g. non-uniform rational B-splines (NURBS). These CAD systems manage parts or assemblies of parts as modeled objects, which are mostly specifications of geometry. Specifically, CAD files contain specifications, from which geometry is generated, which in turn allows for a representation to be generated. Geometry and representation may be stored in a single CAD file or multiple ones. CAD systems include graphic tools for representing the modeled objects to the designers; these tools are dedicated to the display of complex objects—the typical size of a file representing an object in a CAD system being in the range of one Megabyte per part, and an assembly may comprise thousands of parts. A CAD system manages models of objects, which are stored in electronic files.

Also known are Product Lifecycle Management (PLM) solutions, which refer to a business strategy that helps companies to share product data, apply common processes, and leverage corporate knowledge for the development of products from conception to the end of their life, across the concept of extended enterprise. By including the actors (company departments, business partners, suppliers, Original Equipment Manufacturers (OEM), and customers), PLM may allow this network to operate as a single entity to conceptualize, design, build, and support products and processes.

Some PLM solutions make it for instance possible to design and develop products by creating digital mockups (a 3D graphical model of a product). The digital product may be first defined and simulated using an appropriate application. Then, the lean digital manufacturing processes may be defined and modeled.

The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Such PLM solutions comprise a relational database of products. The database comprises a set of textual data and relations between the data. Data typically include technical data related to the products said data being ordered in a hierarchy of data and are indexed to be searchable. The data are representative of the modeled objects, which are often modeled products and processes.

Product lifecycle information, including product configuration, process knowledge and resources information are typically intended to be edited in a collaborative way and in a dynamic way. For this reason notably, modeled objects are intended to be modified a certain number of times after they have been first created.

Any 3D object that is supposed to fit user defined specifications can be simulated through a virtual part. The virtual part is created by the designer using standard modeling features (extrude, revolute, cut, round etc.) or standard surfacing features (sweep, blend, loft, fill, deform, smoothing etc.). Many CAD systems supporting such modeling functions are history based system. This means that the creation history of design features is saved through an acyclic data flow linking the said features together through input and output links.

The history based modeling paradigm is well known since the beginning of the 80's. A solid part is described by two persistent data representations: history and B-rep (i.e. boundary representation). The B-rep is the result of the computations defined in the history. The shape of the part displayed on the screen of the computer is (a tessellation of) the B-rep. The history of the part is the design intent. Basically, the history gathers the information on the operations which the modeled object has undergone. The B-rep is generally saved together with the history because it is not possible to display complex parts only from the history data. The history is saved together with the B-rep in order to allow design changes of the part according to the design intent.

Another advantage of history based paradigm is for a designer to prepare reusable models. Indeed, other designers can reuse models by changing parameters of the history and letting the system update the new part. Since the update leads to the same result as running again the history with the new parameters, the new part is intrinsically compliant with the new design intent.

In such a context, the speed at which the update is performed is of matter, all the more for complex parts or for applications where many modifications are performed. Several technologies of the prior art for updating the part have been disclosed and are discussed below.

A very popular method to update the shape of a modeled object of which history has been modified is the following. First of all, during the creation phase, all intermediate results of the history are saved. A modification is typically for the designer to change the parameters of a feature, in other words, to change the data of a leaf node of the history. In this case, updating is for the system to replay all operations by following the input-output links from the modified leaf node down to the root node. This method holds as well for a multi-root data flow and when several leaf nodes are modified in one shot. Maystrovsky's U.S. Pat. No. 5,850,535 "Roll-back regeneration in a computer-aided design system" typically describes this technology in the particular case of a linear feature list. This update technology features two drawbacks. Firstly, the update time is closely related to the structure of the history (whether it is a linear list or a well balanced tree for example). In many low end CAD systems, the history is a linear list and its structure is out of the designer's reach. In this case, the update time is proportional to the age of the modified feature. When the history structure is controlled by the user, it is an additional difficulty for the user to balance the said history structure while designing a complex part. An inexperienced designer cannot perform this double task. The second drawback is that many operations are recomputed only because they are on the path (from the modified leaf node down to the root node) while they do not influence the resulting solid. In other words, many operations on the update path are spatially far from the actual change. Deciding whether an operation is meaningful or not during the update is a difficult question. As a consequence, the update is slow.

Another update method is to replay all operations of the history. It avoids intermediate results storage, thus saving memory. Some CAD systems used this method in the early 80's, but it is marginally used nowadays. Replaying the whole history after a modification results in an update time that is proportional to the global complexity of the part and not to the complexity of the modification. The designer expects a "simple" change to be updated faster that a "big" change. This behavior is undesirable from the designer's point of view. As a consequence, the update is slow.

Chin's U.S. Pat. No. 7,313,504 "Model management technology using feature chains" does not require history storage. Persistent data are solid primitives together with their respective "scopes" from which the algorithm dynamically generates a transient history structure. Then, the algorithm traverses this structure to compute the new part after a primitive creation or modification. This technology rebuilds a history structure each time the part is modified. Consequently, the update process requires a computation time that is proportional to the number of primitives and not to the complexity of the modification. A very simple modification would require the same amount of computation than a complex modification, which is not optimal from the designer's point of view. As a consequence, the update is slow.

In yet another technology for updating models based on history, all leaf nodes are solids, and all operations are pure Boolean operations (which are union, subtraction, intersection as opposed to non Boolean operations such as round, fillet, draft angle, tweak, thickness, shell). Given a modification intent, for example changing the size or position of a leaf solid, there exists, by theorem, a 3D volume outside which the resulting solid is invariant. This is the "a priori localization volume". In many cases, this knowledge allows a faster update by simplifying the shape of leaf solids that are spatially far from the change, thus performing trivial or simpler operations to compute the new solid. This technology is inspired by the research paper "A null-object detection algorithm for constructive solid geometry" by R. B. Tilove, Communication of the ACM, July 1984, vol. 27, No7. This technology features two drawbacks. Firstly, it does not take into account non Boolean operations such as draft angle, round, fillet, shell and thickness which are very popular in mechanical design. The reason is that it is impossible to anticipate how a round (or fillet, draft angle, shell, thickness) will proliferate on the solid due to tangency propagation, which eliminates the a priori localization volume. This restriction to pure Boolean operations is a major drawback in mechanical design and in solid modeling in general because a real life part always features some non Boolean characteristics (round, fillet, shell etc.). Secondly, even in the pure Boolean case, there are examples when this technology is not efficient. As a consequence, the update is slow, all the more when there are non-Boolean operations in the history.

B-rep modeling is an alternate technology to history based modeling. B-rep modeling does not save the history of the part. Thus, a change is directly and locally performed on the B-rep, by deleting, moving, extrapolating, healing faces, which is very fast compared to history replay. B-rep modeling technology provides a very fast update because there is no history to replay. The first drawback is a lack of semantic. The design intent expressed through the history is lost, and reusing predefined models is not possible. Secondly, not all topological and geometrical changes are possible through B-rep modeling. Finally, a very useful integrity property of history based modeling is that the new part is equal to the part created from scratch with new inputs. B-rep modeling does not guarantee this property. In this technology, there is no need for an update method because the modifications on the model dynamically update it. However, as no information on the operations which the object has undergone is kept, a subsequent modification is actually difficult for the user. Furthermore, B-rep modeling has geometrical and topological restrictions which lead designers to often prefer history based modeling.

Kripac's patent application US2007/0291028 "fast interactive object manipulation" describes a method for real time update of a history based solid. Given the solid primitive to be modified, the algorithm computes a reduced history tree. This reduced history tree is balanced in such a way that the modified primitive is involved in the very last of the last but one operation and is combined to one or two constant solids. The reduced history tree is obtained through algebraic manipulations of the initial history tree. The B-rep representation of the constant solids is computed from scratch. Then, the (hopefully) real time update can start upon user defined changes of the solid primitive. Only interactive manipulation is addressed by this technology, nothing is said about how the modified solid is actually computed for repository purpose. Kripac's algorithm is not compatible with intermediate results saving as described earlier because the history tree is rebalanced for each modification. Beyond the computer time required for algebraic manipulations, the geometrical and topological complexity of the constant solids involved in the reduced history tree is comparable to the complexity of the whole solid. Given that the constant solids are computed from scratch, the consequence is that the reduced history tree step is almost as costly as computing the whole solid from scratch. As a consequence, before the real time capability is available, the designer must wait during a time period that is generally too long. Furthermore, there exists a failure risk because algebraic manipulations may duplicate primitives in the reduced history tree, which causes tangent or locally identical surfaces situations. It is well known that these situations are handled with enormous difficulty by geometrical modelers. Furthermore, the integrity of the data model is not guaranteed because the computation performed by the system to provide the modified solid is totally different from the computation performed to create the solid from the modified primitives through the initial history. As previously mentioned, only interactive manipulation is addressed by this technology. How the final solid is computed before repository saving may need further computation. Drawbacks are thus a costly pre-processing and a potential geometrical fragility. As a consequence, the update is slow.

Solidworks' patent application WO2008/127254 describes a method for "locally updating a three dimensional model". Given a solid defined by a feature list and the corresponding B-rep and given a modified feature, the method determines a subset of features that possibly affect the shape of the solid. These features are related to the modified feature through three kinds of relationships: parent/child relationship, topological adjacency and spatial intersection. Then, topological faces of these features that appear on the solid are removed and/or replaced by faces of modified features. This method is directed to the general case including Boolean (union, subtraction, intersection) and non Boolean operations (round, fillet, draft, thickness, shell etc.). The resulting solid is the same as the solid obtained by regenerating all features from scratch. The first drawback is that in some cases, features are recomputed despite they do not change the resulting solid. The second drawback is that the computing path followed by the system to update the solid is totally different from the computing path to generate the modified solid from scratch. The update performs new computations to get the modified solid, other computations than those performed through a traditional update. As a consequence, the update speed can still be increased.

Besides, it has to be noted that graph theory has been discussed in the context of model modification.

The article entitled "On the use of graph transformation for model refactoring" by T. Mens, of the University of Mons-Hainaut, in Belgium, relates to model refactoring, and shows how graph transformation can provide formal support for this activity.

The article entitled "Scenario integration via higher-order graphs", in Technical report No. 2006-517, by Z. Diskin, J. Dingel, H. Liang, from Queen's University, in Kingston, Ontario, Canada, 2006, also presents the use of graph theory for the management of scenarios involving models.

On graph theory specifically, the thesis entitled "A relation-algebraic approach to graph structure transformation", by W. Kahl, from University of Munich, in Germany, 2002, includes a statement about "the categoric approach to graph transformation". It explains basic categorical push-out and pull-back operations as well as the "double push-out" graph rewriting.

However, there still exists a need for improving the update of a modeled object.

SUMMARY OF THE INVENTION

According to one aspect, the invention therefore provides a computer-implemented method for updating a modeled object comprising:

provideing an old operand of an operation, a result of applying the operation to the old operand, wherein applying the operation to the old operand includes computing old sub-results, each old sub-result being determined by a respective old sub-operand of the old operand, and a new operand including a first set of sub-operands of the new operand at least partially identical to old sub-operands of the old operand, and a second set of new sub-operands, applying the operation on the new operand, including computing new sub-results determined by a respective sub-operand of the second set; and retrieving the old sub-results determined by the old sub-operands of the old operand to which sub-operands of the first set are at least partially identical.

In embodiments, the method may comprise one or more of the following features:

the old sub-operands and the sub-operands of the new operand each comprise a couple of faces, each couple of faces including a first face and a second face, the old sub-results and the new sub-results comprise intersections between the first face and the second face of the respective sub-operand;

the intersections are parametric curves;

for each couple of faces of the sub-operands of the first set, the first face and the second face each share a common surface with the first face and the second face of the partially identical old sub-operand;

faces of the new operand are linked to faces of the old operand, wherein a face of an operand is a first face or a second face of a couple of faces of a sub-operand of the operand;

wherein providing the new operand comprises user modification of the old operand, faces of the new operand being linked to faces of the old operand according to the modification;

faces of the old operand which are not geometrically modified are linked to their corresponding face in the new operand;

faces of the old operand which are reduced or increased are linked to their corresponding face in the new operand;

the method further comprises determining the first set as all the sub-operands of the new operand of which the first face and the second face are both linked to faces of the old operand;

the operation is a Boolean operation between at least a first solid bounded by first faces and a second solid bounded by second faces;

the operation is a solid offset or shell operation and: at least a part of the old sub-operands and the sub-operands of the new operand each comprise a face, the old sub-results and the new sub-results, determined by a respective sub-operand of the part, each comprise an offset face of the face of the respective sub-operand; and/or at least another part of the old sub-operands and the sub-operands of the new operand each comprise a couple of offset faces, the old sub-results and the new sub-results determined by a respective couple of offset faces comprise an intersection curve between the respective couple of offset faces.

According to another aspect, the invention further proposes a computer-aided design system comprising a graphical user interface suitable for performing the above method and a database suitable for storing the old sub-results.

According to another aspect, the invention further proposes a computer program comprising instructions for execution by a computer, the instructions comprising means for performing the above method with a graphical user interface of a computer-aided design system, wherein the system further comprises a database suitable for storing the old sub-results.

According to another aspect, the invention further proposes computer readable storage medium having recorded thereon the above computer program.

BRIEF DESCRIPTION OF THE DRAWINGS

Embodiments of the invention will now be described, by way of non-limiting example, and in reference to the accompanying drawings, where:

FIG. 1 shows a flowchart of an example of the present invention method,

FIGS. 2-22 show an example of the method wherein the operation includes computing the intersections between the faces of two solids.

FIGS. 26-42, show an example of the method wherein the operation includes offsetting a solid.

DETAILED DESCRIPTION OF THE INVENTION

Figure 6:
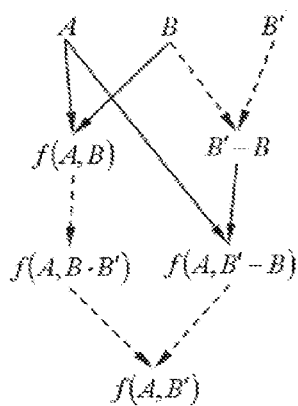

With reference to the flowchart of FIG. 1, it is proposed a method for updating a modeled object. The method comprises providing (S1) an old operand of an operation, a result of applying the operation to the old operand, wherein applying the operation to the old operand includes computing old sub-results, each old sub-result being determined by a respective old sub-operand of the old operand, and a new operand including a first set of sub-operands of the new operand at least partially identical to old sub-operands of the old operand, and a second set of new sub-operands. The method further comprises applying (S2) the operation on the new operand. Applying the operation on the new operand includes computing (S21) new sub-results determined by a respective sub-operand of the second set; and retrieving (S22) the old sub-results determined by the old sub-operands of the old operand to which sub-operands of the first set are at least partially identical. Such a method improves the update of the modeled object.

A modeled object is an object modeled by data allowing a computer manipulation of the object. By extension, it designates the data itself. In its broadest lines, the method is intended for updating any type of modeled object, as long as the modeled object is obtained by applying at least one operation on an operand. Thus, in the method, all modeled objects are obtained by applying operations.

The data modeling the modeled object may thus include data allowing the retrieval of elements of the operation. Thus, the providing (S1) of an old operand of the operation, a result of applying the operation to the old operand, wherein applying the operation to the old operand includes computing old sub-results, each old sub-result being determined by a respective old sub-operand of the old operand, may comprise retrieving all these elements. Notably, the old operand, the old sub-operands and/or the old sub-results may be retrieved from the data modeling the object. In the context of a computer-implemented method, all these elements may be referenced and pointers may lead to them.

The object may for example be a text. In such a case, the operation may be for example an optical character recognition (OCR) operation. The old operand may then be an image of a manuscript text. The old sub-operands may be parts (e.g. corresponding to paragraphs) of the manuscript text. The old sub-results may be the OCR of these parts, the old result being an assembly of these old sub-results. The object may also be a 2D drawing, a mathematical formula, an audio file, a video clip and so on.

In the context of applying the method in CAD, the object may typically be a 3D modeled object, e.g. representing a product such as a part or an assembly of parts. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process. The following examples concern a modeled object which is a 3D modeled object defined in a CAD system. However, the following applies to other types of objects as well.

The modeled object is (or is derived from) the result of applying the operation to an operand. In this sense, the operand is any input of the operation. Applying the operation to the old operand includes computing old sub-results, each old sub-result being determined by a respective old sub-operand of the old operand. A sub-operand designates sub-data of the operand. In an example, the operand is the set of its sub-operands or an assembly of these sub-operands. The sub-operands may be directly stored in the data modeling the object or may be deduced from such data. The old sub-results may also be stored or deductible. A sub-result is determined by a respective sub-operand. This means that a sub-operand fully determines a sub-result, independently of the other sub-operands.

The method is intended for updating a modeled object. In specific, the method provides (S1) a new operand. The new operand is merely an operand of the operation, just like the old operand. However, the new operand is to take the place of the old operand. For example, the new operand may be provided by a user who wants to modify the modeled object. Alternatively, the new operand may derive from such a user action. The modification of the operand (from the old operand to the new operand) may alternatively be fully automatic, for example if the operation is a stock exchange operation and the operand is a stock price, a new operand may be provided automatically and continuously as the stock price evolutes.

In an example in the context of a 3D modeled object defined in a history based CAD system, the new operand may be the result of a previous operation of which operand has been modified. Indeed, history based CAD systems store the whole history of a 3D modeled object as a tree, wherein the leaf nodes are solids and the other nodes are operations. A modification of a user is for these systems typically to change leaf solids of a node operation, the modification being reflected through the whole history, each operation possibly seeing its operand modified as a result. In such a case, the method is typically iterated over the operations of the history, the new result of the previous operation being the new operand of the next operation.

The new operand includes a first set of sub-operands of the new operand at least partially identical to old sub-operands of the old operand, and a second set of new sub-operands. In other words, the sub-operands of the new operand may be classified in two categories: the ones which are similar (i.e. at least partially identical, e.g. sharing common values for at least some of their parameters) to sub-operands of the old operand (the first set) and the other ones (the second set). In general, two sub-operands are partially identical if their respective sub-results are identical or sets of non empty intersection. Typically, modifying the modeled object may comprise modifying the old operand (into the new operand), which in turn may comprise modifying the sub-operands of the old operand. Sub-operands may be deleted, some sub-operands may be modified, and new sub-operands may be added. The method keeps track of this by classifying the sub-operands of the new operand in the two sets.

The method further comprises applying (S2) the operation on the new operand. Indeed, updating the modeled object once the new operand is provided comprises determining the new result of the operation with this new operand. This is performed by applying the operation on the new operand.

Applying the operation on the new operand includes computing (S21) new sub-results determined by a respective sub-operand of the second set. Indeed, the sub-operands of the second set are totally new and sub-results determined by them have to be computed. Computing a sub-result means evaluating how the operation acts on the respective sub-operand. This depends on the operation and on the context of the method. Computing a sub-result may include non-logical operations.

Applying the operation on the new operand however also includes retrieving (S22) the old sub-results determined by the old sub-operands of the old operand to which sub-operands of the first set are at least partially identical. Retrieving the old sub-results means that the method does not evaluate how the operation acts on the sub-operand (as opposed to the computing). Thus, retrieving a sub-result is faster than computing a sub-result.

Instead of applying the operation on the new operand from scratch, the method classifies the sub-operands in two sets in order to retrieve for some of the sub-operands respective sub-results from previous computations (i.e. the old sub-results determined by the old sub-operands to which the sub-operands of the first set are partially identical). The classification and the retrieving of old sub-results may include essentially logical operations and are thus performed very fast. The computing of sub-results is kept to the strict minimum. Thus, the method allows a fast update of a modified modeled object.

In the context of OCR, the old operand may be a manuscript text image and the sub-operands may be parts of this image (for example parts separated by blanks in order to delimit paragraphs). The new operand may be a new manuscript text image including some parts of the old operand (i.e. the first set) and completely new parts (i.e. the second set). Instead of running the OCR on the first set, the method retrieves the old sub-results corresponding to the parts of the old operand which are kept in the new operand. In such a case, the sub-operands of the first set are identical to sub-operands of the old operand. Now, let us say that the new manuscript text is written by another writer. Then, using a similarity measure, it is possible to identify parts of this new manuscript which are similar (i.e. partially identical, to the opposite of strictly identical) to parts of the old operand (i.e. old sub-operands). As will be further discussed, the notion of partial identity depends on the context. In any case, the OCR for these parts belonging to the first set does not need to be performed as it was already performed once for similar parts. The OCR is actually retrieved and the update is thus faster.

The method will now be described in the case the modeled object is a 3D modeled object. In a first example of the method, illustrated with reference to FIGS. 2-22, the operation includes computing the intersections between the faces of two solids. In a second example of the method, illustrated with reference to FIGS. 26-42, the operation includes offsetting a solid.

A first example of the method for updating a 3D modeled object is now discussed with reference to FIGS. 2-22. In this example, the operation includes computing the intersections between the faces of two solids. Reuse of prior computed intersections is then discussed in FIGS. 23-25.

The old sub-operands and the sub-operands of the new operand each comprise a couple of faces. A couple of faces includes two faces which are ordered and are designated as a "first" face and a "second" face according to their order in the couple. The old sub-results and the new sub-results comprise intersections between the first face and the second face of the respective sub-operand. In other words, a sub-operand is a couple of a first face and second face, and the sub-result determined by the respective sub-operand is the intersection(s) between the first face and the second face. For each couple of faces, the respective sub-result may also be the set of all intersections of the support planes of the faces. Such a method allows a fast update of intersections between two solids bounded by faces. Indeed, the faces of the first solid may form the first faces of the sub-operands while the faces of the second sold may form the second faces. By forming couples comprising all combinations of two faces from the first and second solid, all intersections may thus be obtained.

Such a method is particularly useful in the case the operation is a Boolean operation between the first solid bounded by first faces and the second solid bounded by second faces. Indeed, sub-results of the result of a Boolean operation include the intersections between the two solids.

Boolean operations are now discussed.

A basic of 3D modeling algorithms is to compute a new solid from two input solids according to a design operation. Design operations are typically "union", "intersection" and "subtraction" and are often named "Boolean operations". It must however be noted that trimming, splitting, rounding and filleting are also design operations that can take benefit of the method. Nevertheless, the method is first illustrated in the context of Boolean operations.

Input and resulting solids (i.e. operand and result) may be modeled by their boundary representation (B-Rep). The boundary representation captures topological adjacency as well as geometrical definition. Topological objects are called cells, which is a generic name for volume, face, edge and vertex. Cells are pure logical entities. Geometrical objects are planes, surfaces (NURBS, B-spline, Bezier), curves (line, NURBS, B-spline, Bezier), p-curves (explained below) and points, they are numerical entities (mathematical real numbers or computer floating point numbers). All geometrical objects may be subsets of the 3D space. Topological structure may capture that the volume is bounded by faces, a face is bounded by edges and an edge is bounded by vertices. A face is the restriction of a plane or a surface. An edge is the restriction of a curve.

Given a face that is a restriction of a surface S: $[a,b] \times [c,d] \to R^3$, $(u,v) \mapsto S(u,v)$ and an edge bounding the face, the geometrical description of the edge may include a 3D curve and a p-curve ("parametric-curve"). The p-curve p: $[0,1] \to [a,b] \times [c,d]$, $w \mapsto p(w)=(\alpha(w),\beta(w))$ is the definition of the edge in the 2D parameter space $[a,b] \times [c,d]$ of surface S. The 3D curve is the description of the edge in the usual 3D space Q: $[0,1] \to R^3$ and is the combination of the p-curve with the surface: $w \mapsto Q(w)=S(\alpha(w),\beta(w))$. Typically, only the 3D curve may be displayed to the user when the 3D modeled object is displayed.

The description of an edge shared by two faces $S_i:[a_i,b_i] \times [c_i,d_i] \to R^3$ where i=1, 2 may include three elements:
  a p-curve in the 2D parameter space of the first incident surface $p_1$: $[0,1] \to [a_1,b_1] \times [c_1,d_1]$, $w \mapsto p_1(w)=(\alpha_1(w), \beta_1(w))$,
  another p-curve in the 2D parameter space of the second incident surface $p_2:[0,1] \to [a_2,b_2] \times [c_2,d_2]$, $w \mapsto p_2(w)=\alpha_2(w),\beta_2(w))$
  and a unique 3D curve $Q:[0,1] \to R^3$, $w \mapsto Q(w)$ such that for all $w \in [0,1]$, $Q(w)=S_1 \cdot p_1(w)=S_2 \cdot p_2(w)$.

Computing "the intersection curve of surfaces $S_1$ and $S_2$" may be for the surface/surface intersection algorithm to provide two p-curves and a 3D curve as previously defined. Consequently, once computed and stored in the B-rep data structure, the intersection curve of two faces may be easily accessed by visiting the topological and geometrical data structure.

Given two input solids, typical solid modeling algorithm may include the following steps:

Compute the intersection curves between faces of first solid and faces of second solid. After this step, topology and geometry of solids are unchanged but new geometrical objects are created: curves and p-curves.

Split faces of each solid along the intersection curves. After this step, topology of input solids is refined in the sense that some of their faces are changed into two or more adjacent faces. A dedicated data structure or attribute mechanism may capture the relationship between initial faces and their children split faces. Intersection curves computed at previous step give birth to edges shared by four faces: two faces of the first input solid and two faces of the second input solid.

According to the type of the operation (union, intersection, subtraction . . . ) faces that do not contribute to the final result may be discarded. For example, if union operation is performed, faces of first (resp. second) solid located inside the second (resp. first) solid are discarded. Unchanged initial faces that belong to the resulting solid are shared by input solid and resulting solid.

First step performs geometrical operations, mainly surface-surface intersections, and is known to be the most computer time consuming. The update method proposed speeds up this step by retrieving some of the surface-surface intersections previously computed and thus avoid to compute these intersections again. Second and third steps do not involve so many geometrical computations and are mainly concerned by rearranging topology, which is a logical structure. The topological and geometrical data structure allows reading intersection curves (3D curve and p-curves) on the resulting solid.

Boolean operations are now illustrated with reference to FIGS. 2-5. Input solids are two parallelepipeds A and B shown on FIG. 2 and represented as rectangles on the figures (for this representation reason, parallelepipeds may be referred to as "rectangles" in the following). Faces of the solids (represented as edges on the figures) are referenced by numbers. In this example, operation A-B is foreseen.

In the example, the first step is to compute two intersection curves (represented as emphasized vertices on the figures), as illustrated on FIG. 3. One curve 100 between face 4 and face 5 and another curve 102 between faces 3 and face 6 are obtained, as illustrated on FIG. 4. More exactly, the operand is the set of all couples of faces of A and B: $\{(i,j)_{i=1\ldots 4, j=5\ldots 8}\}$. The sub-operands are the couples taken singly. In fact, most sub-operand result in a null sub-result (there is no intersection). Only couples (4, 5) and (3, 6) lead to a non null result.

The second step is to split faces according to intersection curves. Face 4 is split into two adjacent faces 40, as well as face 3 which is split into two adjacent faces 42, as illustrated on FIG. 4. Third step represented on FIG. 5 is to select faces 1,2,9,10,11,12 as the resulting faces, according to the type of the operation: large rectangle A minus small rectangle B in this case. However these two last steps, known per se, are not of directly concern to the method.

The relationships linking faces of the initial solids with faces of the resulting solid may be captured through the following notation j(l)={m, n} means that face l of previous object give birth to faces m and n. For short, j(l)={m} is written j(l)=m. In the example,

| j(1) = 1 | j(2) = 2 | j(3) = 9 | j(4) = 12 |
| j(5) = 11 | j(6) = 10 | j(7) = 0 | j(8) = 0 |

Where, by convention, j(m)=0 means that face m does not belong to the resulting solid and j(m)=m means that face m remains unchanged in the resulting solid. In the context of a computer-implemented method, these relationships are captured by pointers.

The principle of an example of the method with a Boolean operation is now formally described with reference to FIG. 6.

The following algebra is applied. Operations ·, +, − are respectively intersection of lists, addition of lists and subtraction of lists. The word "list" here means "finite set" rather than an ordered collection of objects. Function $f$ represents the first step of the algorithm in the following meaning. Given two faces a,b (i.e. sub-operand (a,b) of operand (A,B)) then $f(a,b)$ is the list of their intersection curves (i.e. sub-result $f(a,b)$). Given A and B two lists of faces, $f(A,B)$ is the list of all intersection curves between faces of A and faces of B (i.e. the list all sub-results). By nature, function $f$ is such that $f(A,B)=f(B,A)$ and $f(A,B+X)=f(A,B)+f(A,X)$. Consequently, elements A,B,B' should be understood as lists of faces rather than solids, but may be referred to as both in the present description.

Let A and B be the input lists of faces and $f(A,B)$ the resulting list of intersection curves obtained through faces of A against faces of B. Notice that the list of all sub-results $f(A,B)$ is not the final solid, but it is an intermediate result (this is why the elements of this list are referred to as "sub"-results). The algorithm is described in the simple case where previous solid A is unchanged. The case when both input solids are changed is illustrated later. Let B' be a modified version of B. The notation B=(B−B')+(B·B') highlights the list of faces B·B' of B shared with B' and the list of faces B−B' of B that are not in B'. The rewriting $f(A,B)=f(A,(B-B')+(B\cdot B'))=f(A,B-B')+f(A,B\cdot B')$ highlights the list of intersection curves $f(A,B\cdot B')$ between faces of A and faces of B·B'. Curves $f(A,B\cdot B')$ are shared with the new result, as proven in the following, and are thus to be retrieved by the method. Indeed, the rewriting B'=(B'−B)+(B·B') highlights the list of faces B·B' of B' shared with B and the list of faces B'−B of B' that are really new. Writing the new result $f(A,B')$ as $f(A,B')=f(A,(B'-B)+(B\cdot B'))=f(A,B'-B)+f(A,B\cdot B')$ highlights the set of really new curves $f(A,B'-B)$ of the new result as well as the list of curves $f(A,B\cdot B')$ of the new result that are shared with the previous result. The overall data flow is gathered in the flowchart of FIG. 6. Dotted arrows correspond to "cheap" operations (they correspond the retrieving (S22) of the method) as opposed to full arrows that are more "expensive" computations.

The method allows to provide the new result $f(A,B')$ by retrieving $f(A,B\cdot B')$ from the previous result, and thus not re-computing intersection curves $f(A,B\cdot B')$, and by only computing the actually new curves $f(A,B'-B)$.

First step is to compute all new intersection curves by comparing all faces of A with all faces of B'−B. This is the implementation of $f(A,B'-B)$ in the algebraic formula. Faces a∈A involved in an intersection computation may be flagged q(a):=1. Initially, all faces a∈A may be q(a):=0. This information is helpful at second step. As explained later, this step can be enhanced in order to compute genuinely new intersection curves.

This may be gathered by the following pseudo-code:

```
For all faces a ∈ A do begin
    For all faces b ∈ B' – B do begin
        If faces a and b intersect then
            Compute and store intersection curves
            between face a and face b.
            q(a) := 1
        End if
    End for
End for
```

Second and last step is to retrieve previous results as much as possible. This step is the implementation of term $f(A,B \cdot B')$ in the algebraic formula. This step makes use of the relationship j linking faces of the previous input solids A,B to their children split faces in the previous resulting solid D. This step makes use of the previous resulting solid data structure D by reading intersection curves of adjacent faces. Operator $\partial$ returns the list of boundary edges of a face. Given faces a∈A and b∈B·B', the condition $\partial j(a) \cdot \partial(b) \neq \phi$ checks if there exists any intersection between faces a and b within the previous result. This test is performed by logical comparison of edges lists. If there exists an intersection and if face a∈A was not involved in any intersection curve computation at previous step (this information is captured by flag q(a)=0), then previous resulting faces j(a) and j(b) can replace faces a and b in the new result under construction. Conversely, if face a was involved in some intersection curve computation at previous step (this information is captured by q(a)=1), then only intersection curves are reused from previous result. This is because face a is trimmed by new faces of B'.

This is gathered in the following pseudo-code:

```
For all faces a ∈ A do begin
    For all faces b ∈ B · B' do begin
        If ∂j(a) · ∂j(b) ≠ φ then
            Replace face b by face(s) j(b)
            If q(a) = 0 then
                Replace face a by face(s) j(a)
            Else
                Add intersection curves of ∂j(a) · ∂j(b)
            End if
        End if
    End for
End for
```

An implementation of the retrieving (S22) applicable to other examples as well is now discussed.

Faces of the new operand may be linked to faces of the old operand. This linking may be performed through pointers or conservation of identifiers. The linking allows a faster retrieving (S22) of the old sub-results.

For example, if providing the new operand comprises user modification of the old operand, faces of the new operand may be linked to faces of the old operand according to the modification. Notably, faces of the old operand which are not geometrically modified may be linked to their corresponding face in the new operand. Thus, for every couple of the first set of sub-operands, the sub-results are retrieved by following the link from the faces of the sub-operand couple to retrieve the old sub-results.

An example of a Boolean operation for the above example algorithm is now provided with reference to FIGS. 7-11.

Figure 7:
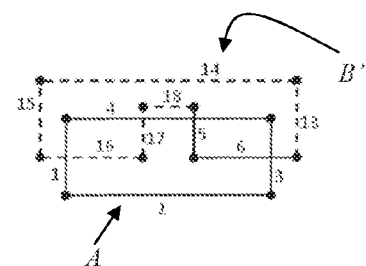

The example is to update the new solid after the small rectangle B of FIGS. 2-5 is changed into the inverted U-shape B', as illustrated by faces 5, 6, 13, 14, 15, 16, 17 and 18 in FIG. 7. Dotted lines are the new faces of new input solid B'. New sub-operands are thus couples involving these new faces. Face numbering captures that face 5 and face 6 of the initial rectangle B are the same in the new version B' of B. In implementations, they may be linked to the corresponding faces in the initial rectangle B as discussed earlier, or identifiers may be kept. Large rectangle A is unchanged.

Figure 8:
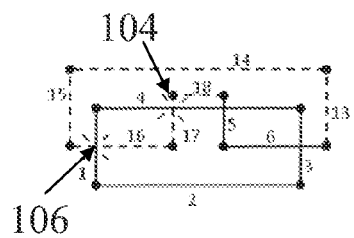

Illustrated on FIG. 8, the first step computes (S21) the new intersection curve 104 between face 17 and face 4 and the new intersection curve 106 between face 1 and face 16. Face 4 and face 1 are flagged q(4)=1 and q(1)=1.

Figure 9:
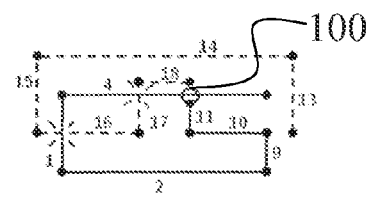

Illustrated on FIG. 9, the second step retrieves intersection curve 102 between face and face 4 from the previous resulting solid (old sub-result 102 is symbolized by a small circle on FIG. 9). This is performed by accessing the edge 100 shared by face 11 and face 12 of the resulting solid: $\partial(4) \cdot \partial j(5) = \partial 12 \cdot \partial 11 = \{100,102\} \cdot \{100,101\} = \{100\}$. The second step may also replace faces 3 and 6 by the adjacent faces 9 and 10 from the previous resulting solid D. The second step may finally replace face 5 by face 11 from the previous resulting solid D. This yields the result on FIG. 9.

Figure 10:
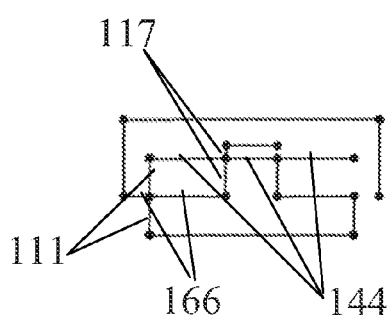
Figure 11:
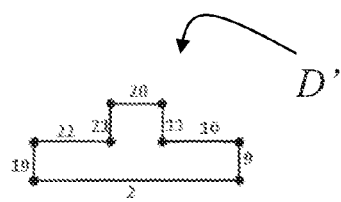
Figure 19:
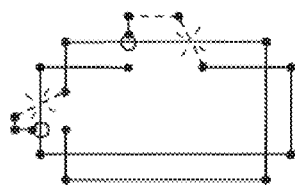
Figure 20:
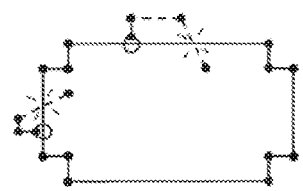
Figure 21:
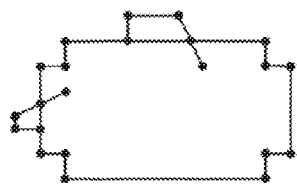
Figure 22:
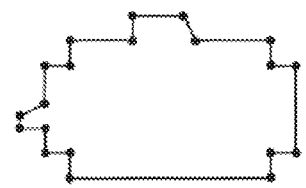

According to the intersection curves, next step may be to split face 4 into three adjacent faces 144, to split face 17 into two adjacent faces 117, to split face 1 into two adjacent faces 111 and to split face 16 into two adjacent faces 166, as illustrated on FIG. 10. The very last step typically provides the resulting solid D' by selecting faces according to the type of the operation, as illustrated on FIG. 11. Notice that face 2 is shared with first input solid A and faces 9, 10 and 11 are reused from previous resulting solid D.

Another example of the Boolean case is now formally described with reference to FIG. 12.

The extension of the previous example to the general case when both input solids A,B are changed respectively into A',B' is formalized through the following formulas. Formulas rewriting B,B' into shared data, old data and new data are B=(B–B')+(B·B') and B'=(B'–B)+(B·B').

New formulas rewriting A, A' into shared data, old data and new data are A=(A–A')+(A·A') and A'=(A'–A)+(A·A').

Then, previous result $f(A,B)$ is reformulated into $$f(A, B) = f((A - A') + (A \cdot A'), (B - B') + (B \cdot B'))$$
$$= f(A - A', B - B') + f(A - A', B \cdot B') +$$
$$f(A \cdot A', B - B') + f(A \cdot A', B \cdot B').$$

New result $f(A',B')$ is reformulated into $$f(A', B') = f((A' - A) + (A \cdot A'), (B' - B) + (B \cdot B'))$$
$$= f(A' - A, B' - B) + f(A' - A, B \cdot B') +$$
$$f(A \cdot A', B' - B) + f(A \cdot A', B \cdot B')$$

As expected, previous result and new results share sub-results $f(A \cdot A', B \cdot B')$. The overall data flow is gathered in FIG. 12 where dotted arrows are "cheap" operations.

Here again, the principle is to compute $f(A',B')$ by retrieving $f(A \cdot A', B \cdot B')$ directly from the previous result, and thus avoiding computation. The algorithm may involve in this example four loops instead of two loops.

First loop is to compute intersections curves between new faces A'–A and new faces B'–B. All these are new intersection curves that have to be computed anyway. This is described by the following pseudo-code:

```
For all faces a ∈ A' – A do begin
    For all faces b ∈ B' – B do begin
        Compute and store intersection curves between
        faces a and b, if any.
    End for
End for
```

Second loop is to compute intersection curves between new faces A'–A and faces B·B' shared with previous input B. Faces b∈B·B' are flagged q(b):=1 when they are involved in an intersection curve computation. This flag is used in the last loop. Initially, q(b):=0 for all faces b∈B·B'. This is described by the following pseudo-code:

```
For all faces a ∈ A' – A do begin
    For all faces b ∈ B · B' do begin
        If faces a and b intersect then
            Compute and store intersection curves
            between faces a and b.
            q(b) := 1
        End if
    End for
End for
```

Third loop is to compute intersection curves between new faces B'–B and faces A·A' shared with previous input A. Here again, faces a∈A·A' are flagged q(a):=1 when they are involved in an intersection curve computation. This flag is used in the last loop. Initially, q(a):=0 for all faces a∈A·A'. This is described by the following pseudo-code:

```
For all faces b ∈ B' – B do begin
    For all faces a ∈ A · A' do begin
        If faces a and b intersect then
            Compute and store intersection curves
            between faces a and b.
            q(a) := 1
        End if
    End for
End for
```

Last loop is to retrieve as much as possible intersection curves and faces available from previous result. This loop makes use of flags computed by second and third loops. Thanks to these flags, we know whether a face of A·A' or B·B' is involved in some intersection curve operation. Flagged faces are potentially modified by the operation and they cannot be replaced by their previous resulting faces. This is described by the following pseudo-code:

```
For all faces a ∈ A · A'  do begin
    For all faces b ∈ B · B' do begin
        If ∂j(a) · ∂j(b) ≠ φ then
            If q(a) = 0 then
                Replace face a by face(s) j(a)
            Else
                Add intersection curves of ∂j(a) · ∂j(b)
            End if
            If q(b) = 0 then
                Replace face b by face(s) j(b)
            Else
                Add intersection curves of ∂j(a) · ∂j(b)
            End if
        End if
    End for
End for
```

Now, an example of the Boolean operation for the example algorithm provided with reference to FIG. 12 is discussed with reference to FIGS. 13-22.

The initial union operation between input solids of the example is illustrated on FIGS. 13-16. FIG. 17 illustrates the new versions of input solids. Notice that they are both modified. Dotted lines illustrate new faces. The first loop computes all new intersection curves, as illustrated on FIG. 18. Second and third loops retrieve intersection curves (small circles) and perform some face replacements as illustrated on FIG. 19. Second and third loops perform as well some face replacements, as illustrated on FIG. 20. Finally, the (traditional) end of the algorithm splits faces according to intersection curves and selects faces that belong to the resulting solid, as illustrated on FIGS. 21-22.

In general, for each couple of faces of the sub-operands of the first set, the first face and the second face each share a common surface with the first face and the second face of the partially identical old sub-operand. In the above example, this partial identity was a full identity. This means than the sub-operands of the first set of sub-operands of the new operand are identical to the corresponding sub-operands of the old operand. In the context of intersection solving for a 3D modeled object, as was the case in the previous examples, this means that the faces of the first set were not modified (i.e. the first face and second face of each sub-operand of the first set are faces already present in the input solids).

However, faces of the old operand may be reduced or increased. The corresponding faces of the new operand may then be linked to the face they are the reduction/increase of, in addition to faces which are not modified. The idea is to retrieve intersections of couples of faces which include at least one face which has been modified, but in a way that intersection curves may be conserved. The concept of "sharing a common surface" for two faces covers the case where the faces are the same, as well as the case where one of the two surfaces is a reduction of the other (the other being an increase of the former). This allows an optimal retrieve of reusable intersections.

For simplicity, in this implementation, faces of the old operand (operands being seen here as the list of couples of faces of two solids) which are not modified, as well as faces which are increased of reduced may all be linked to the faces of the new operand to which they correspond. This may be done by conservation of identifiers, by pointers, and/or by a common sub-identifier. The method may then further comprise determining the first set as all the sub-operands of the new operand of which the first face and the second face are both linked to faces of the old operand.

So far, previous intersection curves are retrieved by using faces that are shared by previous and new input solids. Despite it works very well, this method can ignore some intersection curves in the following case: new input solid features a new face that is the restriction of a plane or surface shared by a face of the previous input solid. It happens for example when the boundary of a face is modified, but not its support plane or surface. Since intersection curves may be computed from geometrical supports (planes or surfaces) they can be retrieved as well in this case, as explained in the following.

A difficulty is that the B-Rep data structure saves the link from the topological cell (the face) toward its geometrical support (the plane or surface). This pointer (from the topological object toward the geometrical object) is designed to facilitate all basic computations: intersection, tessellation, set membership classification, etc. A problem in the context of the method is that the reverse pointer may be useful: from the plane or surface toward the face. Thanks to standard data processing tools (sorting, hash table etc.) a preprocessing step may compute the reverse pointer, and the following algorithm can be implemented. Notation $s=S_X(x)$ symbolizes the direct pointer, meaning that s is the support plane or surface of face x in solid X. The reverse pointer is symbolized by $x=S_X^{-1}(s)$ meaning that x is the face in solid X that is the restriction of plane or surface s. Next loop can replace the first step of the simple version of the algorithm.

---

```
For all faces a ∈ A do begin
    For all faces b' ∈ B' – B do begin
        If faces a and b' intersect then
            If exists b ∈ B such that S_B(b) = S_B'(b') then (*)
                Add intersection curves of ∂j(a) · ∂j(b)
            else
                Compute and store intersection curves
                between face a and face b'.
            End if
            q(a): = 1
        End if
    End for
End for
```

---

(*) This line can be written equivalently: "If exists $b = S_B^{-1}(S_{B'}(b'))$ then"

The extension to the full version of the algorithm (both A and B are modified) is straightforward and is not detailed.

An example illustrating the Boolean case and the reuse of previously computed intersections is now discussed with reference to FIGS. 23-25.

Figure 23:
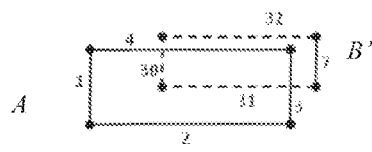
FIGS. 23-25 illustrate reuse of previously computed intersections.

The example is to update the new solid after the small rectangle B is changed into a longer rectangle B', as illustrated by faces 7, 30, 31 and 32 in FIG. 23. Dotted lines are the new faces of input solid B. Face numbering captures that face 7 of the initial rectangle B is the same in the new version B' of B. In the example, new face 31 shares the same supporting plane as face 6 of the previous input solid B. This is symbolized by $S_B(6)=S_{B'}(31)$. Large rectangle A is unchanged.

Figure 24:
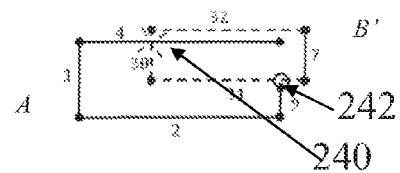
Figure 25:
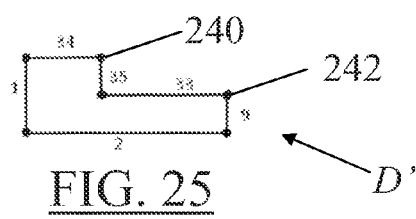

The first step computes the genuinely new intersection curve 240 between face 4 and face 30 (small cross in FIG. 24). Furthermore, it retrieves from previous resulting solid the intersection curve 242 between the supporting plane of face 31 and the supporting plane of face 3 (small circle in FIG. 24). This is possible because the supporting plane of face 31 is the same as the supporting plane of face 6. Furthermore, face 3 of first input solid A is replaced by face 9 of previous resulting solid D. Next step is to yield the new resulting solid through usual algorithm, which results in solid D' of FIG. 25.

The method has been described above for an operation which is a Boolean operation. However, the method is also applicable to other operations such as filleting or rounding. In the case of a fillet or a round operation, the sub-operands are couples of faces meeting at an edge or lists of faces meeting at a vertex. The operation consists in trimming the sub-operand faces and constructing new round surfaces to fill the hole left by the trimming. Foreseen sub-results may thus be the trimming curves and the constructed surfaces for example.

In general, the operation may be any CAD solid operation. In particular, the operation may also be a solid offset or shell operation. In this case at least a part of the old sub-operands and the sub-operands of the new operand each comprise a face. The old sub-results and the new sub-results, determined by a respective sub-operand of the part, each comprise an offset face of the face of the respective sub-operand. The methods is here particularly advantageous because the offset and shell operations are time consuming as they duplicate most faces of the solid. Besides, solid offset and solid shell operations are very popular in mechanical design for thin casted parts such as plastic parts or aluminum parts.

In an example more detailed later, at least another part of the old sub-operands and the sub-operands of the new operand each comprise a couple of offset faces, and the old sub-results and the new sub-results determined by a respective couple of offset faces comprise an intersection curve between the respective couple of offset faces. Indeed, an offset operation consists in duplicating faces (into offset faces), computing the intersections of couples of offset faces, and finally trimming them.

Solid offset and solid shell operations are now discussed with reference to FIGS. 26-30.

Notably, an example of an offset operation is now discussed with reference to FIGS. 26-27.

Figure 26:
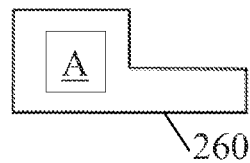
Figure 27:
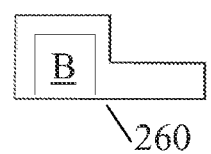

Given an input solid and given an offset value associated to each face of the input solid, the resulting offset solid may be defined by locally increasing or decreasing the dimension of the solid according to the offset values, as illustrated on FIGS. 26-27 which show an example of solid A reduced to solid B by an offset operation. By convention, a positive offset value (locally) adds material to the solid and a negative offset values (locally) removes material from the solid. A face associated with an offset value "zero" remains untouched (lower face 260 of the L-shape solid in FIGS. 26-27).

Figure 28:
Figure 29:
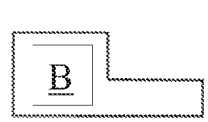
Figure 30:
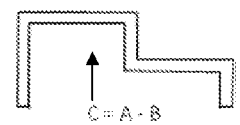
Figure 31:
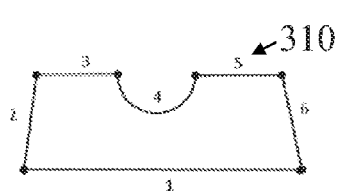
Figure 32:
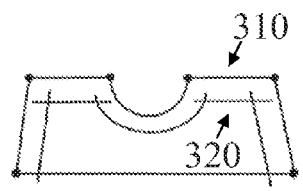
Figure 33:
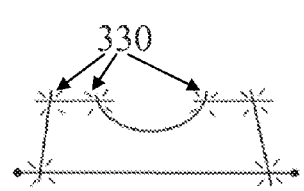
Figure 34:
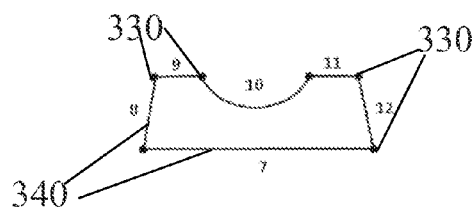

An example of a shell operation is now discussed with reference to FIGS. 28-30.

Solid shell operation may be to compute a thin solid C (also named a "shell") from a thick solid A. Given an input solid A, the thick solid, and given offset values associated with faces of solid A, the solid shell operation first computes the solid offset B and then performs a subtraction operation. If all offset values are non negative, the solid offset B is larger than the input solid A and the subtraction C=B−A is performed. If all offset values are non positive, the solid offset B is smaller than the initial solid A and the operation C=A−B is performed. Faces of the initial solid associated with a zero offset value give birth to the openings of the resulting thin solid C, as illustrated on FIGS. 28-30 through the lower face of the L-shape solid.

If, for example, the solid shell operation is to be computed on both sides of the initial solid, then two offset values are associated to each face. The method may create two solid offsets and perform the operation "large solid offset minus small solid offset", which yields the resulting thin solid iC.

The bottom line is that the solid shell operation involves one or two solid offset operations together with one Boolean operation (subtraction). Consequently, only the method for accelerating the solid offset operation is exemplified in the following. The solid shell operation inherits performance from both the solid offset operation and the Boolean operation (described previously).

The application of the method for a solid offset operation is now exemplified with reference to FIGS. 31-42.

The traditional solid offset algorithm mainly runs four steps. The first step is to compute offset faces of all faces of the input solid. The main task here, in terms of computer time, is offset computation of support planes and surfaces. These offset faces are computed independently, so they locally overlap (as illustrated on FIG. 32 which represents offset faces 320 of faces of solid 310 of FIG. 31) or they are locally separated. The second step is to extrapolate faces that are separated in such a way that they intersect (not illustrated). The third step is to compute intersection curves 330 between couples of overlapping faces (illustrated on FIG. 33).

The fourth and last step is to mutually trim these offset (and extrapolated) faces in order to provide the closed boundary 340 of the resulting solid offset. The link between input faces and resulting faces captures the offset relationship, as illustrated on FIG. 34. j(1)=7 j(2)=8 j(3)=9 j(4)=10 j (5)= 11 j(6)=12

Now, the input solid may be changed according to FIG. 35. The right hand side features a protrusion 350 (faces 13, 14 and 15) while left and top sides are unchanged (faces 2, 3, 4 and 5). Dotted lines represent new faces. Solid lines represent unchanged faces.

Let A be the set of faces of the previous input solid, let A' be the set of faces of the new input solid. This defines A'−A and A'·A respectively the set of new faces of the new input solid and the set of faces of the new input solid shared with the previous input solid and associated with the same offset values. A face of the new input solid that is shared with the previous input solid and that is associated with a different offset value is considered as a new input face. Let B be the previous offset solid.

The method may start by computing offset faces of all new input faces, as illustrated in the following pseudo-code:

```
For all faces a' ∈ A' − A do begin
    Compute the offset support of face a'
End for
```

The result is represented on FIG. 36.

Then, offset faces of unchanged faces are retrieved from the previous result with the help of relationships, as illustrated in the following pseudo-code:

```
For all faces a ∈ A · A' do begin
    If j(a) ≠ 0 then (*)
        Retrieve S_B(j(a)) as the offset support of face
        a
    else
        Compute the offset support of face a
    End if
End for
```

(*) This means that the offset of face a did not disappear in the previous resulting offset solid B.

The result is represented on FIG. 37.

From now on, faces of the input solid are not illustrated. Let Off(X) the set of offset faces of the set of faces X. Elements of Off(X) are noted Off(x) meaning that Off(x) is the offset face of x. Solid lines are offset faces of unchanged faces Off(A'·A) and dotted lines are offset faces of new faces Off(A'−A).

According to the method, offset faces 380 are extrapolated when needed (as illustrated on FIG. 38).

The intersection curves computation may include three sub-steps. The first sub-step computes intersection curves between offset surfaces of new faces. This is illustrated in the following pseudo-code:

```
For all faces a' ∈ Off(A' − A) do begin
    For all faces b' ∈ Off(A' − A) other than a' do begin
        Compute and store intersection curve between a'
        and b'
    End for
End for
```

The intersections curves computed by the above loop are represented as crosses on FIG. 39.

Next sub-step retrieves intersection curves by using previous resulting offset solid. Faces a∈Off(A'·A) are flagged q(a):=1 when they are involved in an intersection curve computation with a face of Off(A'−A). This flag is used by next sub-step. Initially, q(a):=0 for all faces a∈Off(A'·A).

```
For all faces a' ∈ Off(A' − A) do begin
    For all faces a ∈ Off(A' · A) do begin
        If faces a' and a intersect then
            Compute and store intersection curves
            between faces a' and a .
            q(a): = 1
        End if
    End for
End for
```

Small circles on FIG. 40 represent intersection curves with previous resulting offset surfaces. It should be noticed that the support surface of the new face 16 is the same as the one of the previous face 1, so the intersection curve 200 between face 16 with the offset face Off(2) is retrieved from previous result. Intersection curve 201 is retrieved from previous result as well because new face 13 is a topological restriction of the support surface of previous face 6 and because face 5 is reused in the new input solid. Finally, offset faces Off(3) and Off(4) are flagged "0" while offset faces Off(2) and Off(5) are flagged "1".

Last sub-step retrieves topological trimming from previous result.

```
For all faces Off(a) ∈ Off(A' · A) do begin
    For all faces Off(b) ∈ Off(A' · A) other than Off(a) do
    begin
        if ∂j(a) · ∂j(b) ≠ φ then
            If q(Off(a)) = 0 then
                Replace face Off(a) by face (s)  j(a)
            Else
                Add intersection curves of ∂j(a) · ∂j(b)
            End if
            If q(Off(b)) = 0 then
                Replace face b by face (s)  j(b)
            Else
                Add intersection curves of ∂j(a) · ∂j(b)
            End if
        End if
    End for
End for
```

In the example, topological trimming is retrieved because faces 2, 3, 4 and 5 of the previous input solid are reused in the new input solid and because offset faces Off(3) and Off(4) are flagged "0" as separated from all new offset faces. Consequently, offset faces Off(3) and Off(4) are replaced by their corresponding faces in the previous result, respectively j(3)=9 and j(4)=10. Additional small circles on FIG. 41 represent intersection curves retrieved from previous result when one of the offset faces is flagged "1".

The traditional end of solid offset algorithm finishes the computation of the resulting solid, as illustrated on FIG. 42. It should be noticed that faces 9 and 10 of previous resulting offset solid are reused in the new offset solid.

Figure 43:
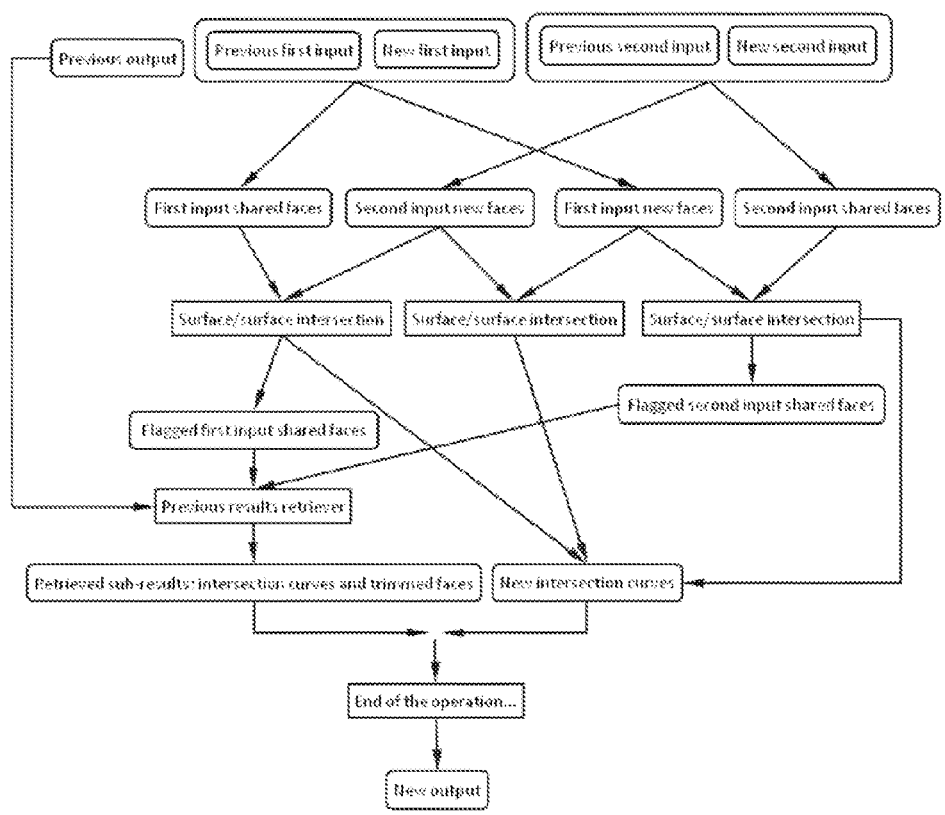
FIG. 43 shows a flowchart of an example of the method.

The method is particularly effective in the following context example. Flowchart of FIG. 43 represents an example of the method in such a context.

A previous operation is performed, and previous input objects as well as previous output object are saved in the database. Then the user modifies input objects by providing new versions of said input objects and asks the CAD system to update the output object. By carefully analyzing the new versions of input objects and the previous output object, the method avoids avoidable computation by directly retrieving partial results from the previous output object. Depending on the operation type, these partial results are intersection curves, face-face trimming, round and fillet ribbon faces, or any geometrical or topological result.

The method may deal with solid objects and surface objects modeled by their boundary representation (B-Rep). All traditional 3D modeling operations can take benefit of the invention: solid modeling Boolean operations (union, intersection, subtraction), rounding and filleting, surface cut etc.

By retrieving partial results from previous output object, the method avoids computation, which accelerates the updating process. This is particularly efficient for two reasons. Firstly, geometrical computations are saved, which are known to be the most computer time consuming. Secondly, while designing a virtual 3D object, the user spends 80% of time changing and updating a previous version of the design, which is precisely where the method is efficient. Furthermore, reusing existing data saves computing memory as well as database memory by avoiding data duplication. Finally, the method makes use of data that are usually saved by current history based CAD systems, namely previous input objects and previous output objects. This makes the method easily implementable within current CAD systems.

The method is typically run with a computer-aided design system comprising a graphical user interface suitable for performing the method, and a database suitable for storing the old sub-results. Such a system allows faster CAD. Indeed, in most cases of update, such a system will run the method and thus save time.

A computer program may comprise instructions for execution by a computer, the instructions comprising means for performing the method with the graphical user interface of the computer-aided design system. A computer readable storage medium may have recorded thereon the computer program.

The above method is computer-implemented, which means that the steps of the method are executed by a computer. However, the triggering of at least some of the steps of the method may be performed through user-computer interaction. The level of user-computer interaction required may depend on the level of automatism foreseen and put in balance with the need to implement the user's desideratum. In embodiments, this level may be user-defined and/or pre-defined. Typically, the providing of the new operand is performed by a user while other actions of the method are performed by the computer.

Thus, the invention is also directed to a CAD system suitable for performing the method. In practice, a user is provided with a graphical user interface (or GUI) such as the one of CATIA, the GUI being in relation with a means, e.g. a database, for storing data necessary to the execution of the method.

Figure 44:
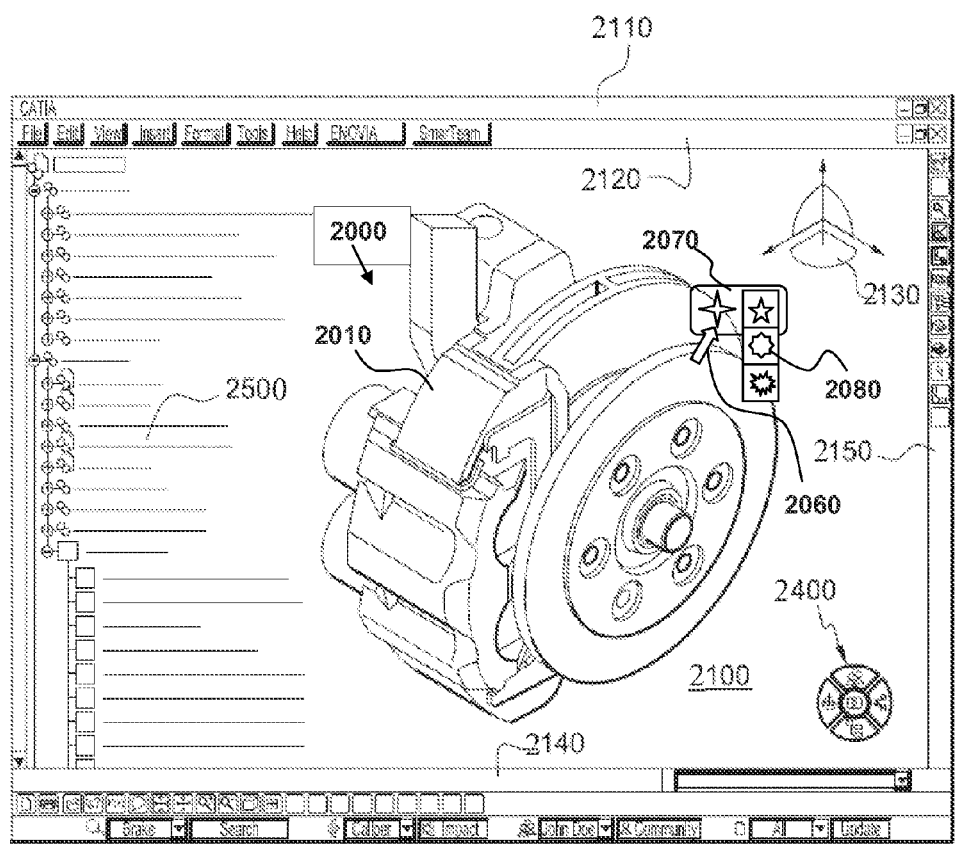
FIG. 44 shows an example of a graphical user interface.

In reference to FIG. 44, the exemplified graphical user interface (or GUI) 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art.

Some of these icons are associated with software tools, adapted for editing and/or working on the 3D object which is a modeled product 2000 or parts 2010 of product 2000 such as that displayed in the GUI 2100. In the following description, "product", "part", "assembly" and the like may be referred to as "part" for the sake of simplicity. Note that the concept The concept of "part" can in fact be generalized to that of "object", wherein an object can be only a "physical" part of the designed product or, more generally, any software tool participating in the design process (but not necessarily "in" the final product).

The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of a 3D modeled object displayed on the screen.

The GUI may for example display data 2500 related to the displayed product 2000. In the example of FIG. 44, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

It is to be understood that the part 2000 can be any object in any configuration capable of being defined by a CAD/CAM/CAE system, or any system used to display views of an object from varying viewpoints. The invention may thus be implemented on a computer program comprising instructions by a computer, the instructions comprising means for causing the above system to perform the above method. The invention may for example be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output.

The invention may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language, or in assembly or machine language if desired; and in any case, the language may be a compiled or interpreted language.

Figure 45:
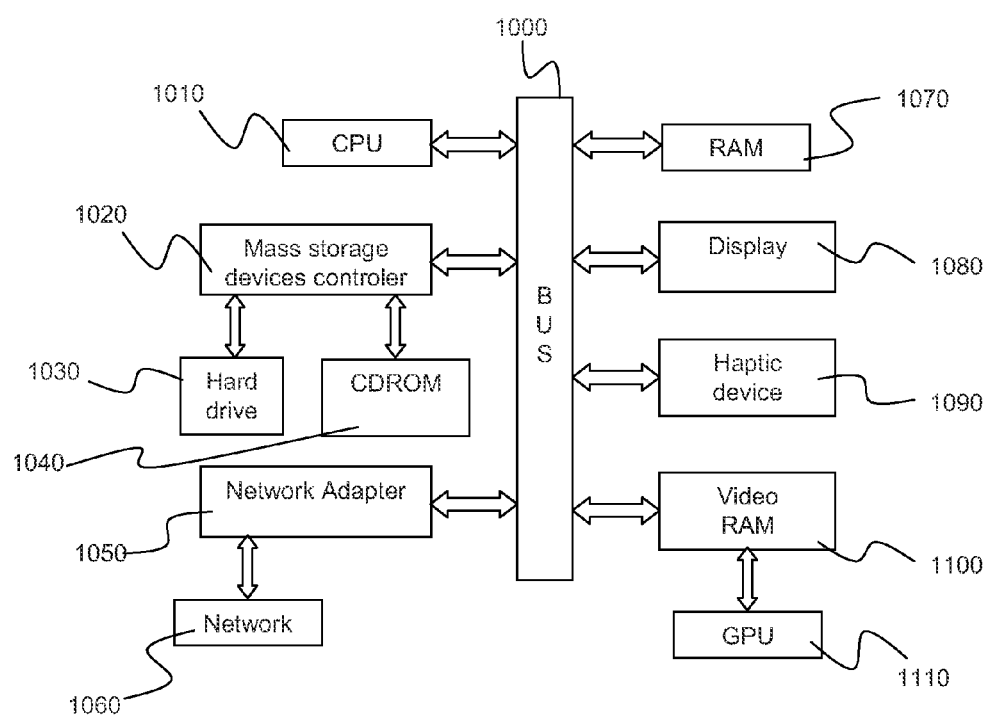
FIG. 45 shows an example of a client computer system.

FIG. 45 shows a client computer system, e.g. a workstation of a user. The client computer comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080, as mentioned with reference to FIG. 44. In addition, the cursor control device allows the user to select various commands, and input control signals. The cursor control device includes a number of signal generation devices for input control signals to system. Typically, a cursor control device may be a mouse, the button of the mouse being used to generate the signals.

The invention claimed is:

1. A computer-implemented method for updating a modeled object, wherein the method comprises:
   providing, by a processor:
      an old operand of an operation, wherein the operation is a node of a stored history tree of the modeled object, the stored history tree comprising leaf nodes that are solids and other nodes that are operations,
      a result of applying the operation to the old operand, wherein applying the operation to the old operand includes computing old sub-results, each old sub-result being determined by a respective old sub-operand of the old operand, and
      a new operand including a first set of new sub-operands of the new operand at least partially identical to old sub-operands of the old operand, and a second set of new sub-operands,
   applying, by a processor, the operation on the new operand, including:
      computing new sub-results fully determined by a respective sub-operand of the second set, independently of other sub-operands; and
      retrieving the old sub-results determined by the old sub-operands of the old operand to which sub-operands of the first set are at least partially identical.

2. The method of claim 1 wherein:
   the old sub-operands and the sub-operands of the new operand each comprise a couple of faces, each couple of faces including a first face and a second face,
   the old sub-results and the new sub-results comprise intersections between the first face and the second face of the respective sub-operand.

3. The method of claim 2 wherein the intersections are parametric curves.

4. The method of claim 2 wherein for each couple of faces of the sub-operands of the first set, the first face and the second face each share a common surface with the first face and the second face of the partially identical old sub-operand.

5. The method of claim 2, wherein faces of the new operand are linked to faces of the old operand, wherein a face of an operand is a first face or a second face of a couple of faces of a sub-operand of the operand.

6. The method of claim 5, wherein providing the new operand comprises user modification of the old operand, faces of the new operand being linked to faces of the old operand according to the modification.

7. The method of claim 6, wherein faces of the old operand which are not geometrically modified are linked to their corresponding face in the new operand.

8. The method of claim 7, wherein faces of the old operand which are reduced or increased are linked to their corresponding face in the new operand.

9. The method of claim 5 wherein the method further comprises determining the first set as all the sub-operands of the new operand of which the first face and the second face are both linked to faces of the old operand.

10. The method of claim 2, wherein the operation is a Boolean operation between at least a first solid bounded by first faces and a second solid bounded by second faces.

11. The method of claim 1, wherein the operation is a solid offset or shell operation and:
   at least a part of the old sub-operands and the sub-operands of the new operand each comprise a face,
   the old sub-results and the new sub-results, determined by a respective sub-operand of the part, each comprise an offset face of the face of the respective sub-operand.

12. The method of claim 11, wherein:
   at least another part of the old sub-operands and the sub-operands of the new operand each comprise a couple of offset faces,
   the old sub-results and the new sub-results determined by a respective couple of offset faces comprise an intersection curve between the respective couple of offset faces.

13. A computer-aided design system comprising:
   a) a computer system;
   b) a graphical user interface suitable for performing a method for updating a modeled object, wherein the method comprises:
   providing:
      an old operand of an operation, wherein the operation is a node of a stored history tree of the modeled object, the stored history tree comprising leaf nodes that are solids and other nodes that are operations,
      a result of applying the operation to the old operand, wherein applying the operation to the old operand includes computing old sub-results, each old sub-result being determined by a respective old sub-operand of the old operand, and
      a new operand including a first set of new sub-operands of the new operand at least partially identical to old sub-operands of the old operand, and a second set of new sub-operands,
   applying the operation on the new operand, including:
      computing new sub-results fully determined by a respective sub-operand of the second set, independently of other sub-operands; and
      retrieving the old sub-results determined by the old sub-operands of the old operand to which sub-operands of the first set are at least partially identical;
   c) a database suitable for storing the old sub-results.

14. A non-transitory computer readable storage medium having recorded thereon a computer program for execution by a computer, the instructions comprising means for performing a method for updating a modeled object with a graphical user interface of a computer-aided design system, wherein the method comprises:
   providing:
      an old operand of an operation, wherein the operation is a node of a stored history tree of the modeled object, the stored history tree comprising leaf nodes that are solids and other nodes that are operations,
      a result of applying the operation to the old operand, wherein applying the operation to the old operand includes computing old sub-results, each old sub-result being determined by a respective old sub-operand of the old operand, and
      a new operand including a first set of new sub-operands of the new operand at least partially identical to old sub-operands of the old operand, and a second set of new sub-operands, applying the operation on the new operand, including:
   computing new sub-results fully determined by a respective sub-operand of the second set, independently of other sub-operands; and
   retrieving the old sub-results determined by the old sub-operands of the old operand to which sub-operands of the first set are at least partially identical;
wherein the system further comprises a database suitable for storing the old sub-results.

\* \* \* \* \*